(12) United States Patent  
Yahiro et al.

(10) Patent No.: US 6,283,782 B1  
(45) Date of Patent: Sep. 4, 2001

(54) LOW-PROFILE AND ROBUST ELECTRICAL CONNECTOR

(75) Inventors: Yasufumi Yahiro, Musashimurayama; Nobukazu Kato, Fussa, both of (JP)

(73) Assignee: Japan Aviation Electronics Indusry, Limited, Tokyo (JP)

( * ) Notice: Subject to any disclaimer, the term of this patent is extended or adjusted under 35 U.S.C. 154(b) by 0 days.

(21) Appl. No.: 09/610,233

(22) Filed: Jul. 5, 2000

(30) Foreign Application Priority Data

Jul. 5, 1999 (JP) .................................................. 11-190956

(51) Int. Cl.$^7$ .................................................. H01R 4/50
(52) U.S. Cl. .......................................... 439/342; 439/259
(58) Field of Search .................................. 439/342, 343, 439/376, 259

(56) References Cited

U.S. PATENT DOCUMENTS

| | | | |
|---|---|---|---|
| 2,186,601 | * 1/1940 | Borkenstein | 439/117 |
| 2,227,123 | * 12/1940 | Christen | 439/117 |
| 4,034,172 | * 7/1977 | Glover et al. | 200/51.1 |
| 5,569,045 | * 10/1996 | Hsu | 439/342 |
| 5,641,297 | * 6/1997 | Kozel | 439/342 |
| 5,762,511 | 6/1998 | Scheitz et al. | 439/342 |

FOREIGN PATENT DOCUMENTS

WO 96/24173   8/1996  (WO) .............................. H01R/4/50

OTHER PUBLICATIONS

European Search Report, European Patent Office, Communication, 20.10.00, EPO Form 1507.0(03.95), EPO Form 1503 03.82 (P04C01).

* cited by examiner

Primary Examiner—Brian Sircus  
Assistant Examiner—Thanh-Tam Le  
(74) Attorney, Agent, or Firm—Laff, Whitesel & Saret, Ltd.; J. Warren Whitesel

(57) ABSTRACT

In an electrical connector which has a first insulator (1a), a first contact (7) supported by the first insulator, a second insulator (2a) faced to the first insulator in a first direction, and a second contact (2a) supported by the second insulator, the second insulator has a side wall defining a groove (9) extending along the first insulator to have a first and a second part arranged in a second direction (A2) perpendicular to the first direction. The first contact has a first contacting portion (7a) inserted into the first part and carried towards the second part by relative movement between the first and the second insulators in the second direction. The second contact has a second contacting portion (8a) being of a flat shape, placed in the second part, and supported by the side wall. The second contacting portion extends in a direction approximate to the second direction. When carried to the second part of the groove, the first contacting portion is brought into contact with the second contacting portion with an elastic force in a third direction (A3) perpendicular to the first and the second directions.

15 Claims, 16 Drawing Sheets

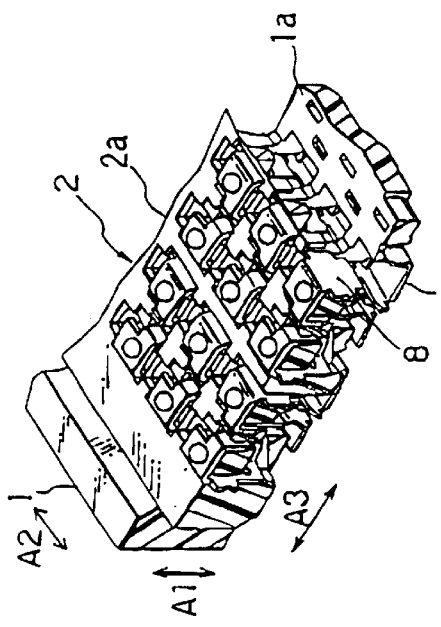
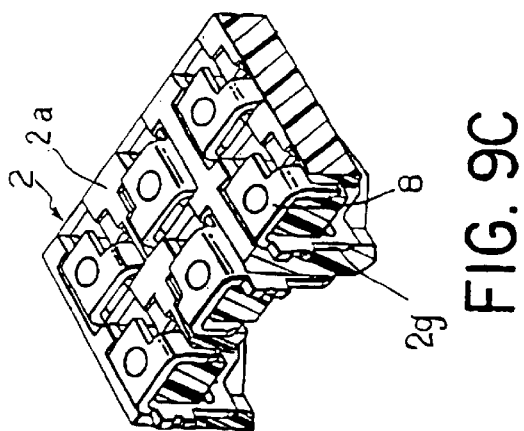
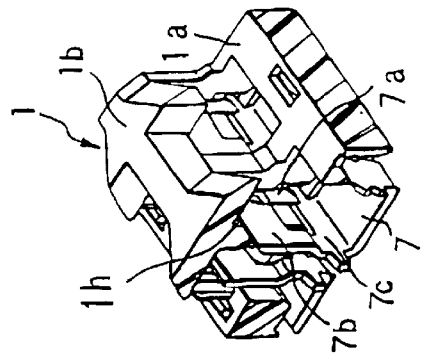
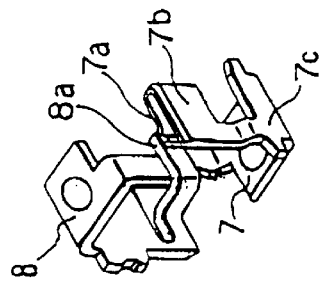
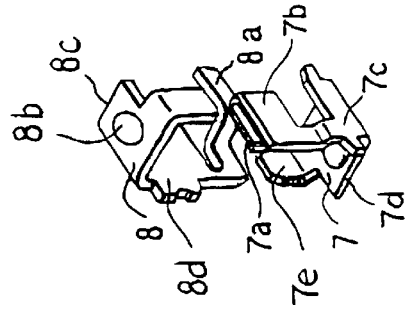

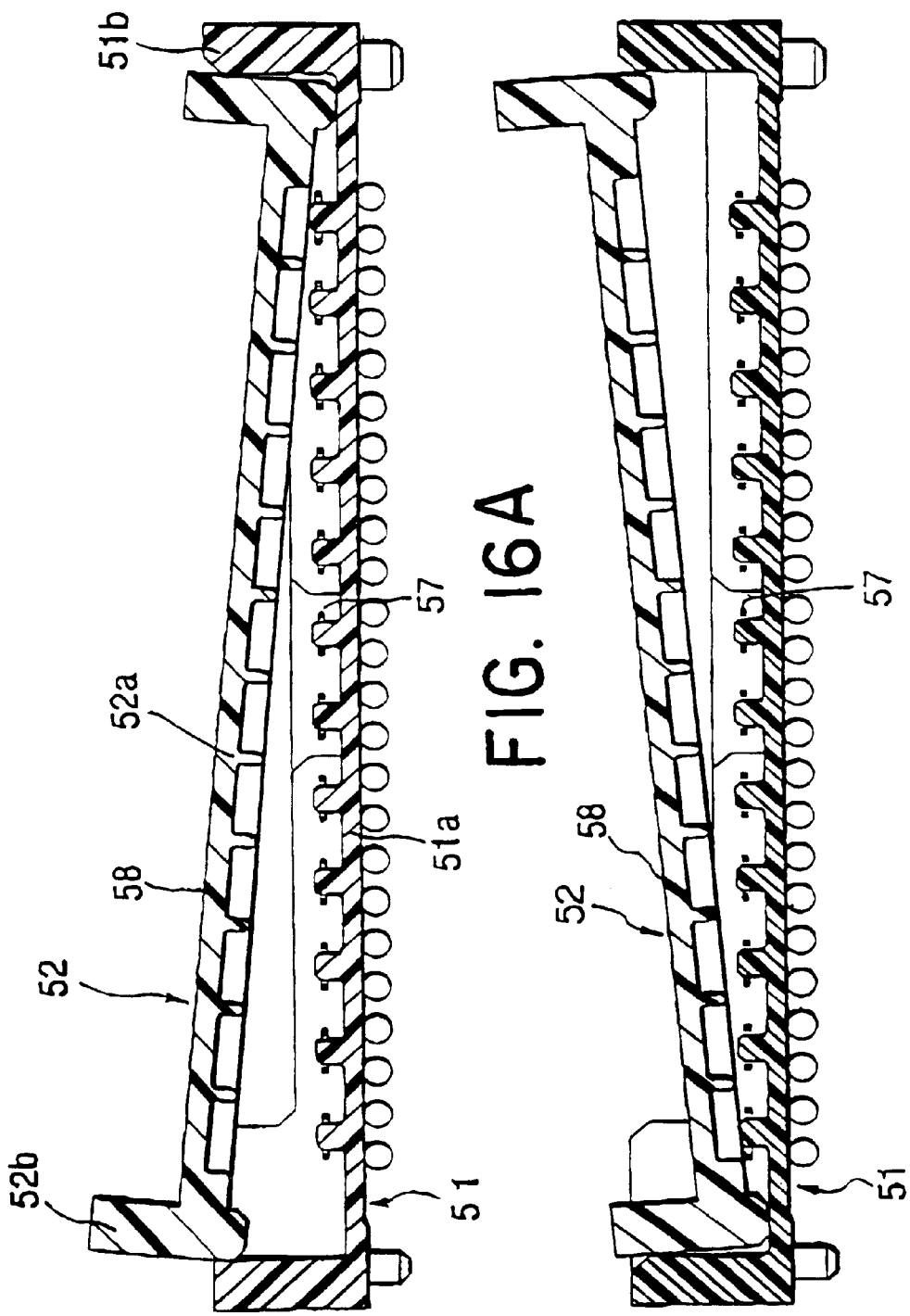

LOW-PROFILE AND ROBUST ELECTRICAL CONNECTOR

BACKGROUND OF THE INVENTION

This invention relates to an electrical connector adapted to be used as a socket for connecting an object such as a CPU package having a land grid array (LGA) or a ball grid array (BGA).

An electrical connector called a pin grid array (PGA) socket is known. As will later be described with reference to the drawing, the PGA socket comprises a first insulator having a number of socket contacts, a PGA conversion adapter having a number of pin contacts, and a second insulator interposed between the first insulator and the PGA conversion adapter. The pin contacts are faced to the socket contacts via a number of through holes formed in the second insulator. In order to connect and disconnect the object, the first and the second insulators are relatively moved with respect to each other. Following the relative movement, the pin contacts are contacted with or separated from the socket contacts.

If the PGA socket having the pin contacts is subjected to an external force during transportation or handling, the pin contacts may be deformed, for example, bent, flexed, or warped. Such deformation of the pin contacts will cause a pitch error which prevents proper engagement between the pin contacts and the socket contacts.

If each of the pin contacts is increased in diameter in order to enhance its mechanical strength, a contact redundancy is reduced. It Is noted here that the contact redundancy is an ability of assuring a reliable contact or connection between two elements such as the pin contact and the socket contact. The reduction in contact redundancy is one of factors causing contact failure between the pin contacts and the socket contacts when the PGA socket is subjected to mechanical vibration or shock.

The presence of the PGA conversion adapter interposed between the first and the second insulators contributes to an increase in profile of the PGA socket in correspondence to the height of the PGA conversion adapter.

SUMMARY OF THE INVENTION

It is therefore an object of this invention to provide a low-profile electrical connector capable of enhancing its mechanical strength without deteriorating a contact redundancy.

Other objects of this invention will become clear as the description proceeds.

According to an aspect of this invention, there is provided an electrical connector which comprises a first insulator, a first contact supported by the first insulator and having a first contacting portion, a second insulator faced to the first insulator in a first direction and having a side wall defining a groove which extends along the first insulator to have a first and a second part arranged in a second direction perpendicular to the first direction, and a second contact having a second contacting portion which is placed in the second part of the groove and supported by the side wall. In the electrical connector, the second contacting portion is of a flat shape and extending in a particular direction approximate to the second direction, the first contacting portion being inserted into the first part of the groove and carried towards the second part of the groove by relative movement between the first and the second insulators in the second direction, the first contacting portion having an elastic force when in the second part of the groove, and being brought into contact with the second contacting portion with the elastic force in a third direction perpendicular to the first and the second directions.

BRIEF DESCRIPTION OF THE DRAWING

FIG. 9A is a perspective view of a part of the BGA socket illustrated in FIG. 5;

FIG. 9B is a perspective view of a plug contained in the BGA socket illustrated in FIG. 5;

FIG. 9C is a perspective view of a part of a receptacle contained in the BGA socket illustrated in FIG. 5;

FIG. 10A is a perspective view of a plug contact and a socket contact contained in the BGA socket illustrated in FIG. 5 before the plug contact and the socket contact are connected to each other;

FIG. 10B is a perspective view similar to FIG. 10A but after the plug contact and the socket contact are connected to each other;

FIG. 16A is a sectional view of the BGA socket in FIG. 13 when a receptacle is inclined clockwise with respect to a plug; and FIG. 16B is a sectional view similar to FIG. 16A but when the receptacle is inclined counterclockwise with respect to the plug.

DESCRIPTION OF THE PREFERRED EMBODIMENTS

Figure 1:
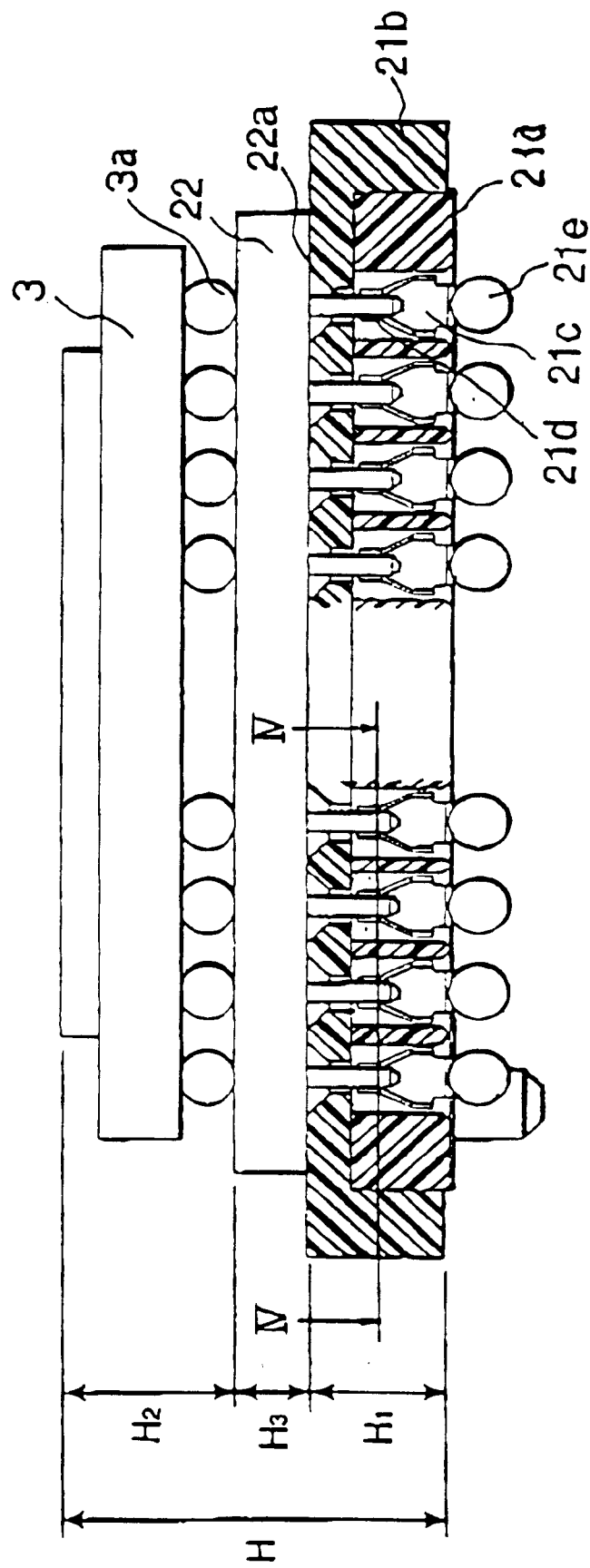
FIG. 1 is a sectional view of a conventional PGA socket after a CPU package is connected thereto.
Figures 2, 3:
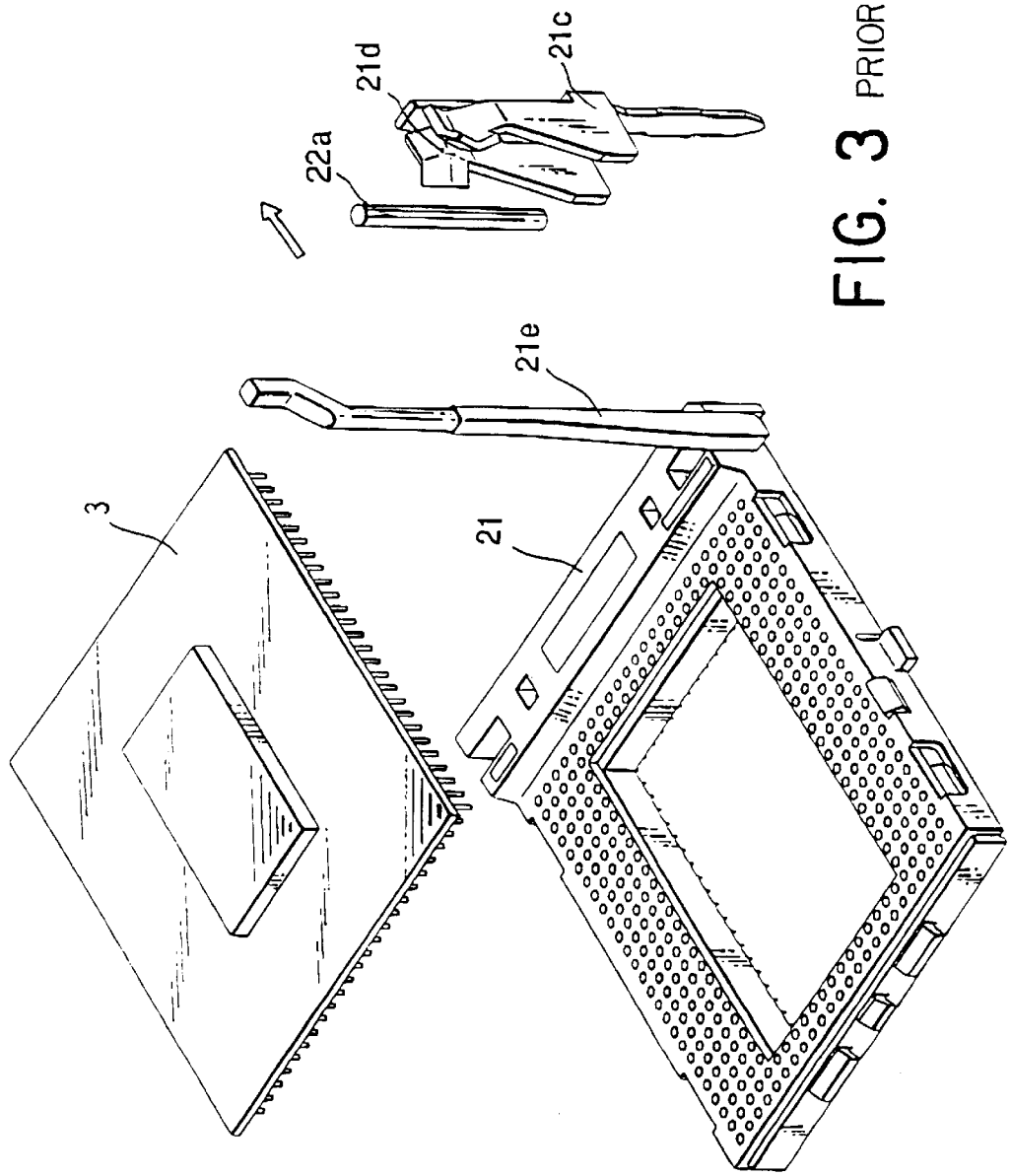
FIG. 2 is a perspective view of the conventional PGA socket in FIG. 1 before the CPU package is connected thereto.
FIG. 3 is an enlarged perspective view of a socket contact and a pin contact used in the conventional PGA socket illustrated in FIG. 1.

Referring to FIGS. 1 through 3, a conventional PGA socket will be described first.

In the PGA socket illustrated in the figures, a base insulator 21a is inserted into a cover insulator 21b. The base insulator 21a includes a number of socket contacts 21c attached thereto in a matrix arrangement. Each socket contact 21c has one end provided with a pair of socket contacting portions 21d and the other end connected to a bump 21e fused thereto. On the cover insulator 21b, a PGA conversion adapter 22 is mounted. The PGA conversion adapter 22 has a number of pin contacts 22a each of which passes through each of a number of through holes formed in the cover insulator 21b to be brought into contact with each of the socket contacting portions 21d. On-the PGA conversion adapter 22, a CPU package 3 having a number of bumps 3a is mounted. The PGA socket is designed to have a grid arrangement of a pitch of 1.27 mm and has a coupling height H given by:

$$H=H1+H2+H3,$$

where H1, H2, and H3 represent heights of the cover insulator 21b, the CPU package 3, and the PGA conversion adapter 22, respectively.

Figure 4A:
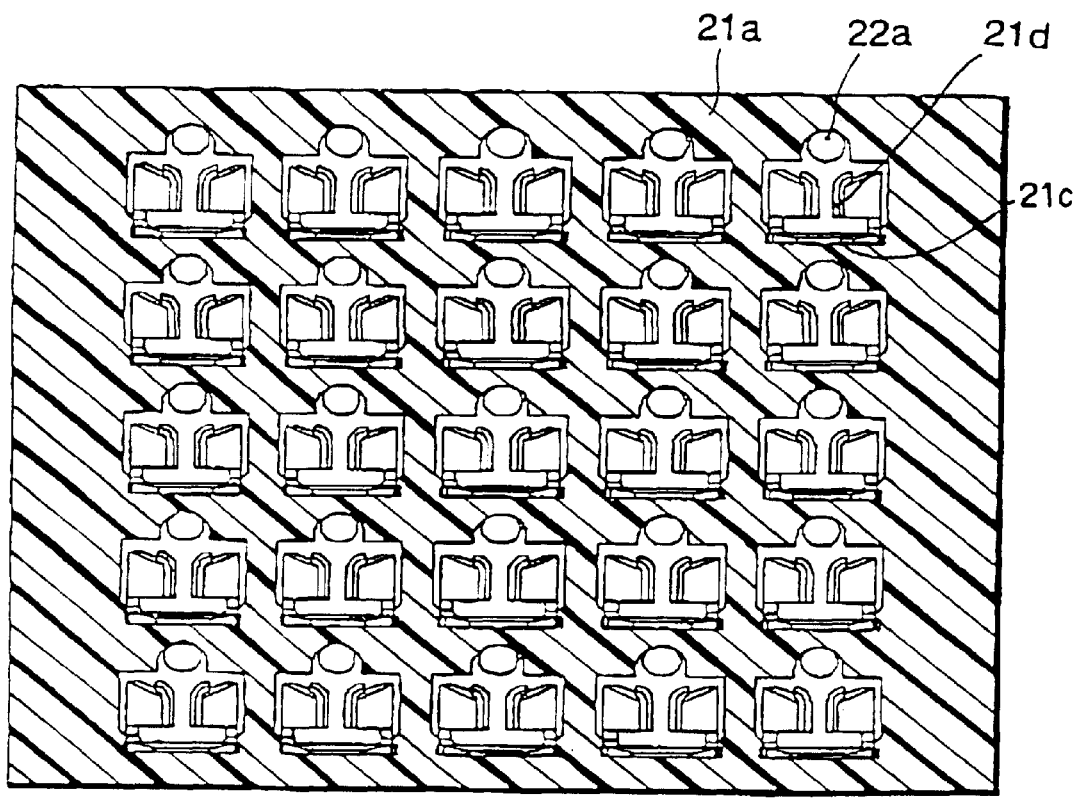
FIG. 4A is a sectional view taken along a line IV—IV in FIG. 1 before the CPU package is connected thereto.
Figure 4B:
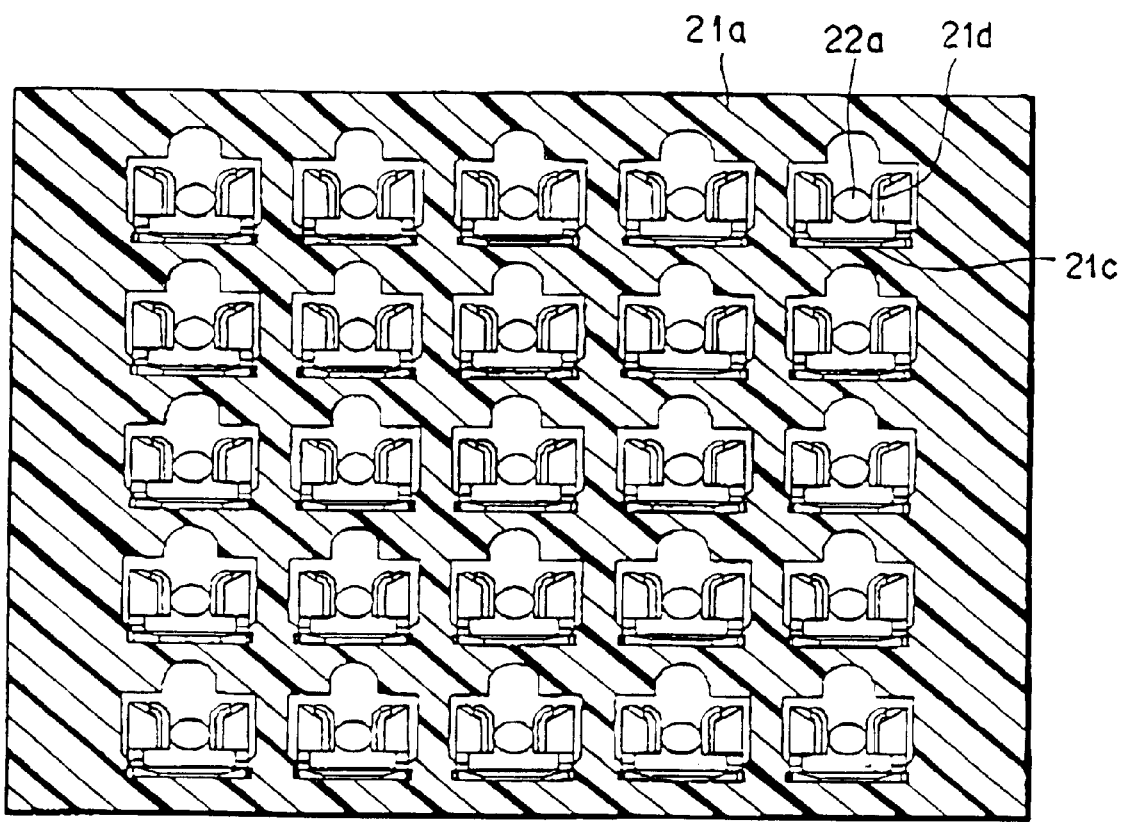
FIG. 4B is a sectional view similar to FIG. 4A but after the CPU package is connected thereto.

To the PGA socket 21, a lever 21f is attached to be rotatable in an angle of 90° between a standing position illustrated in FIG. 2 and a horizontal position where the lever 21f extends along one side surface of the PGA socket 21. When the lever 21f is located at the standing position, each pin contact 22a is separated from the socket contacting portions 21d of each socket contact 21c as illustrated in FIG. 4A. When the lever 21f is rotated by 90° from the standing position to the horizontal position, the cover insulator 21b is driven by a cam mechanism (not shown) to slide along the base insulator 21a. Then, as illustrated in FIG. 4B, each pin contact 22a is inserted between the socket contacting portions 21d of each socket contact 21c to be brought into contact therewith.

If the PGA socket has a grid arrangement of a pitch of 2.54 mm or a staggered grid arrangement of a pitch of 2.54 mm, a desired contact redundancy and a desired mechanical strength of the pin contacts will be achieved. However, if the pitch of the grid arrangement is reduced to 1.27 mm, the contact redundancy, which is most important in high-reliability applications, is not assured and the strength of the pin contacts is decreased. The decrease in contact redundancy is one of factors causing disengagement or contact failure between the pin contact and the socket contact when the PGA socket is subjected to mechanical vibration or shock. The contact redundancy of the PGA socket will later be described in detail.

During transportation or handling of the PGA socket, the pin contacts may possibly be subjected to an external force. If the strength of the pin contacts is decreased, the pin contacts will readily be bent even if such external force is small. This results in occurrence of a pitch error of the pin contacts and therefore prevents proper engagement.

It is noted here that a correlation exists between the mechanical strength of the pin contacts and the contact redundancy. Specifically, if the mechanical strength of the pin contacts is enhanced by increasing the diameter of each pin contact, a spare area for the socket contact is reduced so that the contact redundancy is reduced. On the contrary, the contact redundancy can be increased by relatively widening the spare area for the socket contact with respect to the pin contact. To this end, the diameter of the pin contact is reduced so that the mechanical strength of the pin contacts is reduced.

Figure 5:
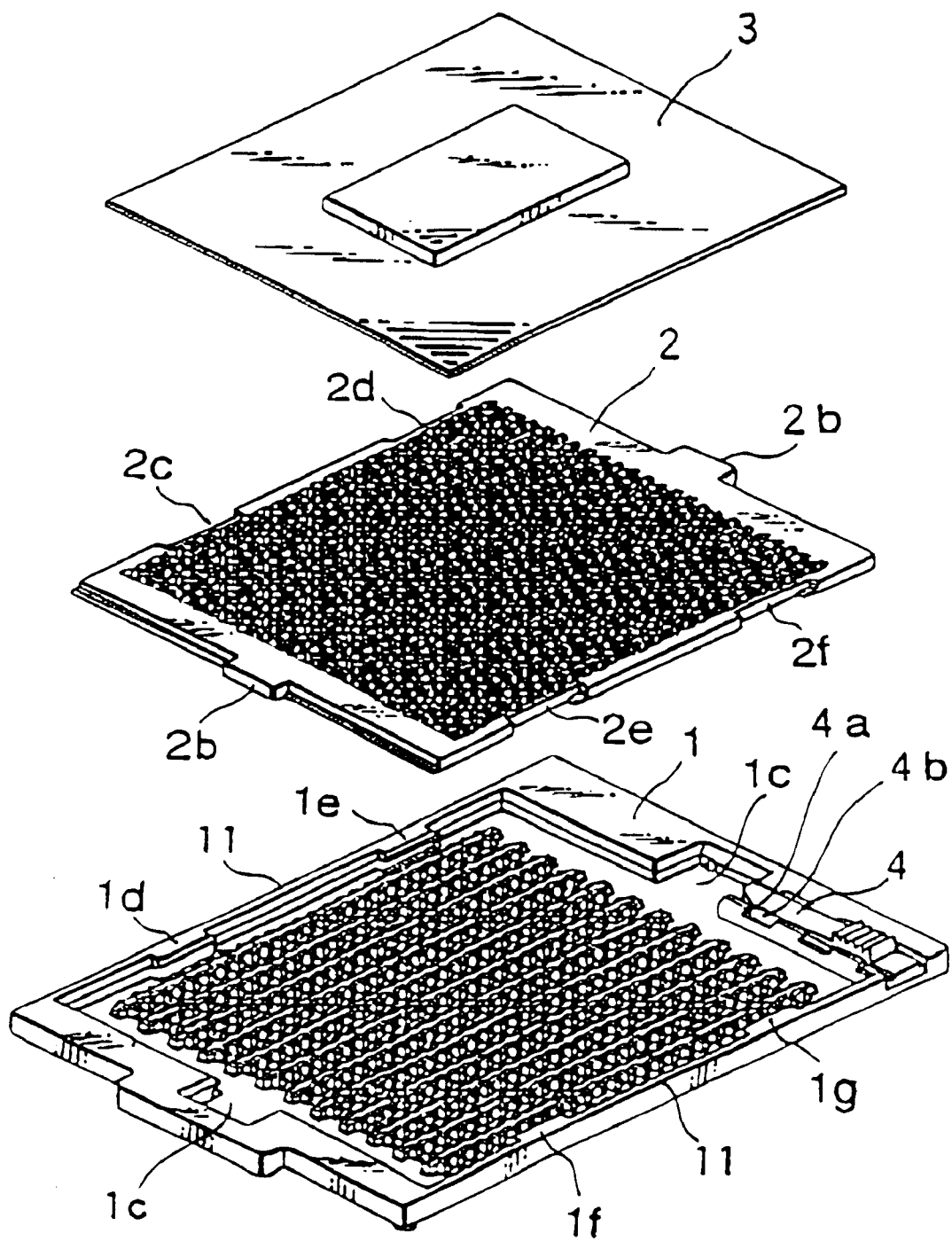
FIG. 5 is an exploded perspective view showing a BGA socket as an electrical connector according to a first embodiment of this invention together with a CPU package.
Figure 6:
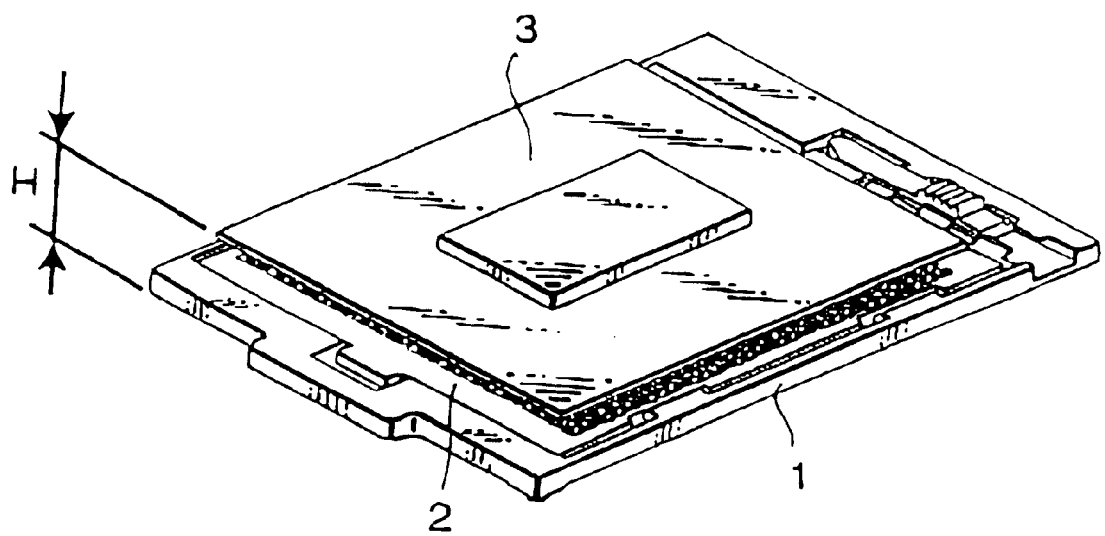
FIG. 6 is a perspective view of the BGA socket in FIG. 5 after the CPU package is connected thereto.

Next referring to FIGS. 5 and 6, description will be made about an electrical connector according to a first embodiment of this invention.

The electrical connector illustrated in the figures is called a BGA socket and used in connection of a CPU package 3. The BGA socket comprises a plug 1 and a receptacle 2. The plug 1 has a pair of recesses 1c formed inside at opposite positions. One of the recesses 1c is provided with a locking member 4 formed along one side of the plug 1 to be movable forward and backward. On the other hand, the receptacle 2 is provided with a pair of protrusions 2b formed outside at opposite positions. The locking member 4 has a cam portion 4a adapted to press a corresponding one of the protrusions 2b and an engaging portion 4b to be engaged with the recess 1c to maintain a locking state. In order to prevent a coupling error in which the plug 1 is inadvertently reversed with its left side lumed right and then coupled to the receptacle 2, the recesses 1c are different in size from each other and the protrusions 2b are different in size from each other.

The plug 1 has a pair of protrusions 1d and 1e and another pair of protrusions 1f and 1g formed on opposite side walls 11 thereof, respectively, to protrude inward. The receptacle 2 has a pair of recesses 2c and 2d for receiving the protrusions 1d and 1e, respectively, and another pair of recesses 2e and 2f for receiving the protrusions 1f and 1g, respectively. The protrusions 1d and 1e are different in size or position from each other and the protrusions 1f and 1g are different in size or position from each other. Likewise, the recesses 2c and 2d are different in size or position from each other and the recesses 2e and 2f are different in size or position from each other. With this structure, it is possible to avoid a coupling error between the plug 1 and the receptacle 2.

Figure 7:
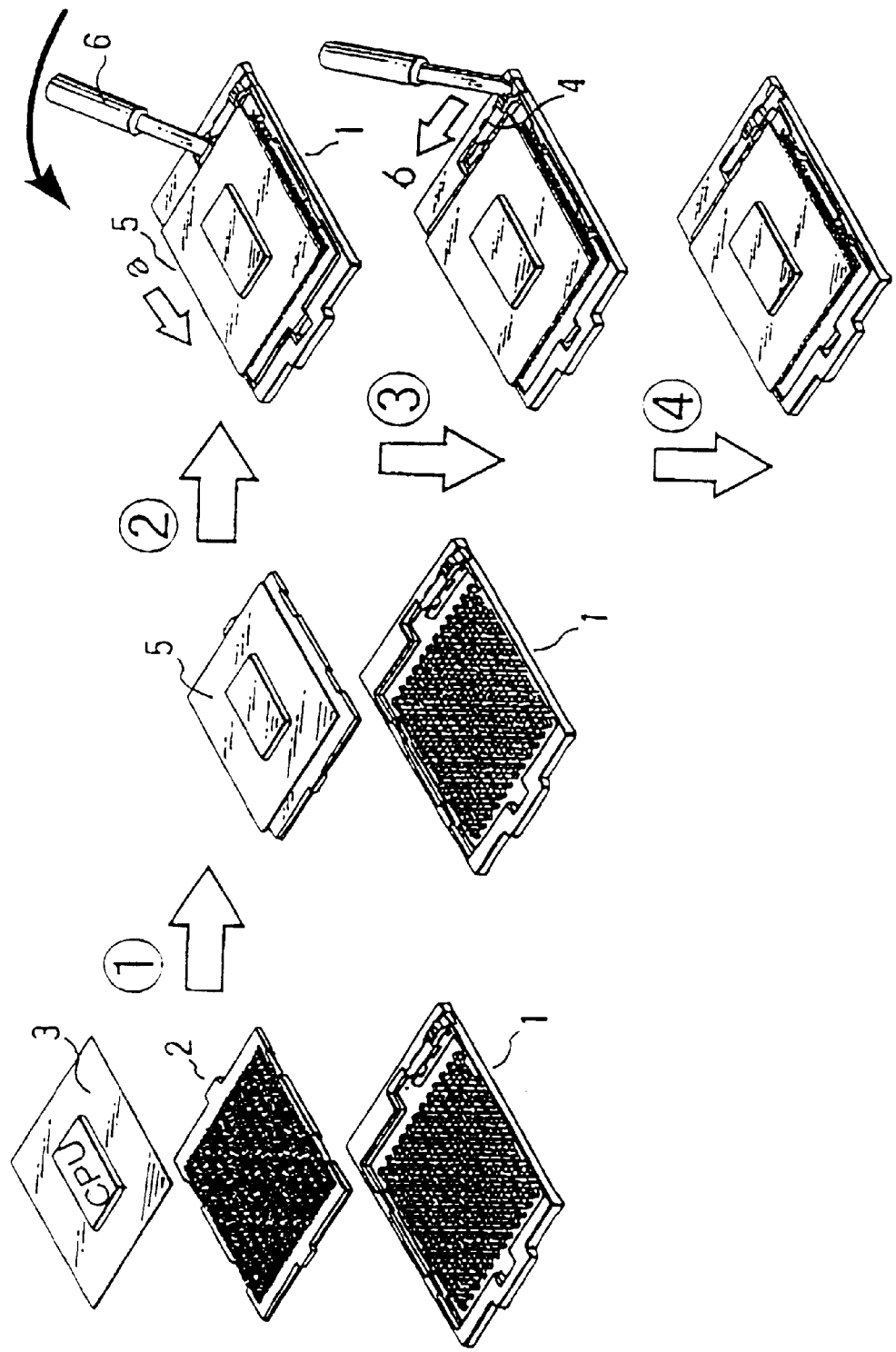
FIG. 7 is a perspective view for describing a series of operations of assembling the BGA socket in FIG. 5 and connecting the CPU package.

Referring to FIG. 7, a series of operations of assembling the BGA socket and coupling the plug and the receptacle will be described. As illustrated at the left in the figure, the plug 1, the receptacle 2, and the CPU package 3 are separately prepared. Then, the CPU package 3 is mounted on the receptacle 2 by reflowing to form an IC-mounted receptacle 5 as illustrated at the center in the figure. The IC-mounted receptacle 5 is put on the plug 1 as illustrated at the right in the figure. In this state, the IC-mounted receptacle 5 is pushed by a screw driver 6 to slide in a direction a with respect to the plug 1. Then, the IC-mounted receptacle 5 is coupled to the plug 1. In order to maintain coupling or to prevent decoupling, the locking member (shutter) 4 is pushed by the screw driver 6 to slide in a direction b. Thus, the BGA socket maintains a stable coupling state.

Referring to FIGS. 8 through 10B, description will be made of the structure of the BGA socket in detail.

The plug 1 comprises a plug insulator 1a as a first insulator, and a number of plug contacts 7 as first contacts engaged with and held by the plug insulator 1a. The plug contacts 7 are arranged in a matrix pattern. Each of the plug contacts 7 has a plug contacting portion (first contacting portion) 7a. The receptacle 2 includes a receptacle insulator 2a as a second insulator faced to the plug insulator 1a in a first direction A1, and a number of receptacle contacts 8 engaged with and held by the receptacle insulator 2a. The receptacle contacts 8 are arranged in a matrix pattern. Each of the receptacle contacts 8 has a receptacle contacting portion (second contacting portion) 8a.

Figure 8:
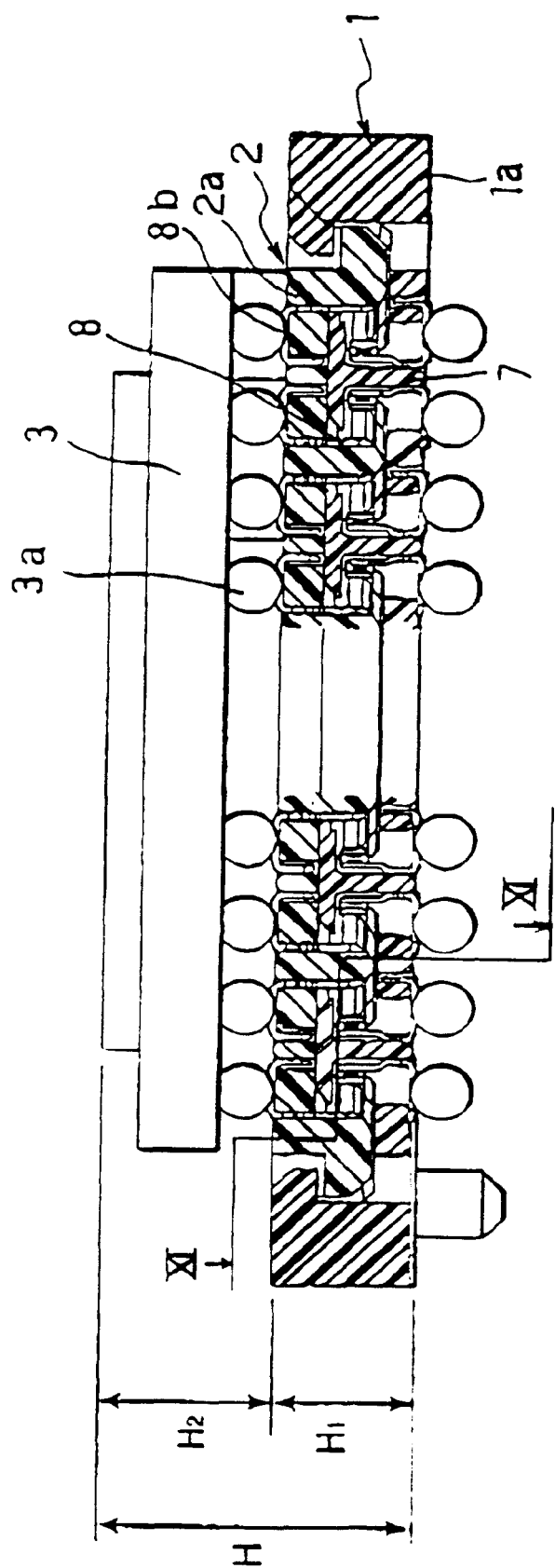
FIG. 8 is a sectional view of the BGA socket in FIG. 5 after the CPU package is connected thereto.

The receptacle insulator 2a is slidable along the plug insulator 1a in a second direction A2 perpendicular to the first direction A1. In FIG. 8, the second direction A2 corresponds to a direction perpendicular to the plane of the drawing sheet. Following the sliding movement of the receptacle insulator 2a in the second direction A2, the receptacle contacting portion 8a of the receptacle contact 8 is brought into contact with or separated from the plug contacting portion 7a of the plug contact 7.

Each receptacle contact 8 is provided with a depression or recess 8b formed on a top surface thereof to serve as a connecting portion for receiving and connecting each bump 3a of the CPU package 3. The bump 3a may be replaced by a conductor attached to the CPU package 3 by a bonding wire or an adhesive.

In FIG. 8, H represents a coupling height from a bottom surface of the plug insulator 1a to a top surface of the CPU package 3 in a coupling state of the BGA socket. It is assumed that the plug 1 and the CPU package 3 have heights H1 and H2, respectively, which are equal to those in the conventional connector. Then, the coupling height H is given by H=H1+H2. Thus, the coupling height H(=H1−H2) of the BGA socket is smaller than the coupling height H(=H1+H2+H3) of the PGA socket illustrated in FIG. 1 by a value corresponding to the height H3 of the PGA conversion adapter 22.

Figure 11A:
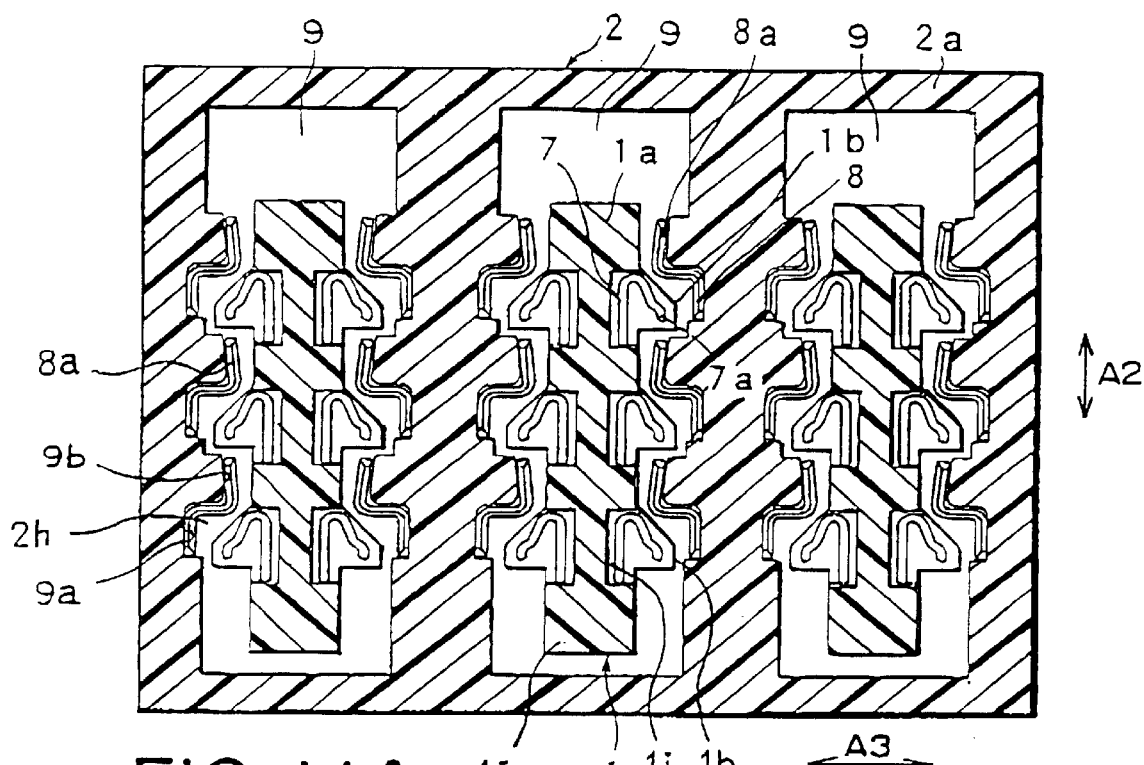
FIG. 11A is a sectional view taken along a line XI—XI in FIG. 8 before the plug contact and the socket contact are connected to each other.
Figure 11B:
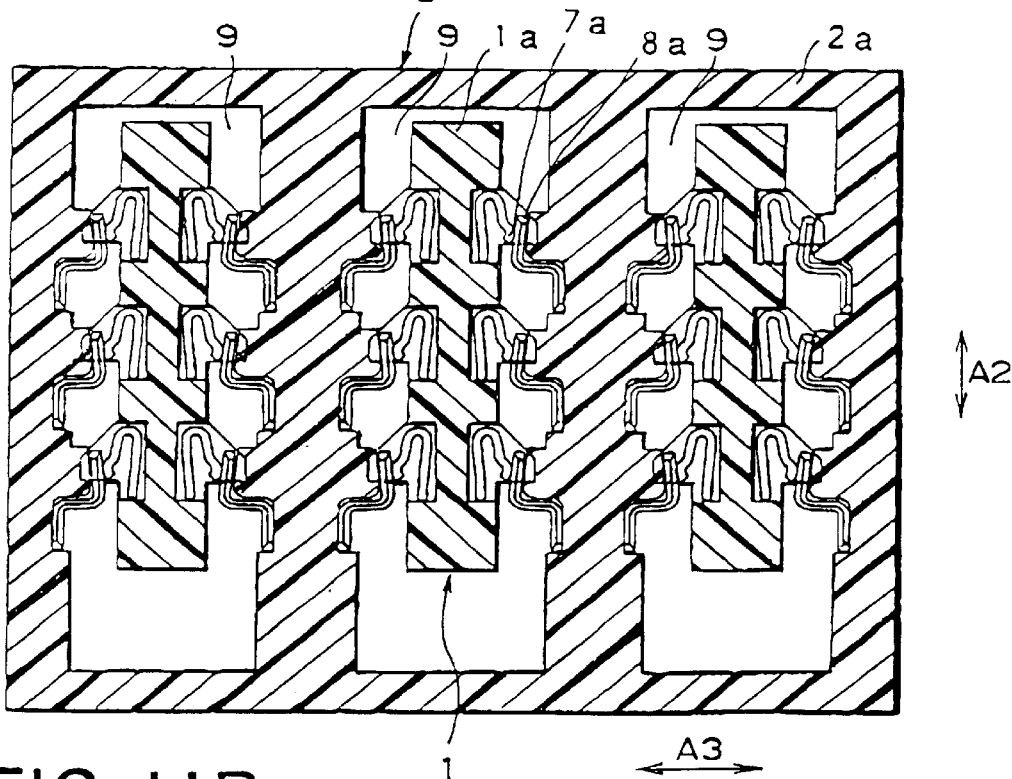
FIG. 11B is a sectional view similar to FIG. 11A but after the plug contact and the socket contact are connected to each other.

Further referring to FIGS. 11A and 11B in addition, the receptacle insulator 2a is provided with a plurality of grooves 9 formed on its surface faced to the plug insulator 1a and extending in the second direction. Each groove 9 is defined between a pair of side walls faced to each other in a third direction A3 perpendicular to the first and the second directions A1 and A2. Each groove 9 has a plurality of first parts 9a and a plurality of second parts 9b each of which is arranged adjacent to each of the first parts in the second direction A2. The socket contacting portion 7a of each socket contact 7 is inserted into the first part 9a of each groove 9. The receptacle contacting portion 8a of a flat shape of each receptacle contact 8 is placed at the second part of each groove 9 and supported by each side wall of the groove 9. The receptacle contacting portion 8a extends in a particular direction approximate to the second direction A2. When the plug contacting portion 7a is inserted into the groove 9 at the first part of the side wall, the receptacle contacting portion 8a is separated from the plug contacting portion 7a. When the receptacle insulator 2a is moved in the second direction A2 to obtain the state illustrated in FIG. 11B, the receptacle contacting portion 8a is moved to the second part 9b of the groove 9 to be brought into contact with the plug contacting portion 7a.

Referring to FIGS. 8 through 11B, the structure of the BGA socket will be described more in detail.

The receptacle contact 8 of the receptacle 2 comprises a connecting portion 8b of a rectangular plate shape, a press-fit portion 8d extending from one end of the connecting portion 8c in the first direction A1, and the receptacle contacting portion 8a extending from an extended end of the press-fit portion 8d in the second direction A2 in a crank-like fashion.

The receptacle insulator 2a has, in addition to the above-mentioned groove 9, a plurality of press-fit holes 2g and a plurality of contacting portion insert holes (not shown) to receive the press-fit portions 8d and the contacting portions 8a of the receptacle contacts 8, respectively. The receptacle contacts 8 are arranged in the receptacle insulator 2a in a matrix fashion.

Each receptacle contact 8 is fixed when the press-fit portion 8d is press-fitted into the press-fit hole 2g of the receptacle insulator 2a. The receptacle contacting portion 8a passes through the contacting portion insert hole of the receptacle insulator 2a to be positioned and supported on the side surface of the second part 9b of the groove 9. The connecting portion 8c of the receptacle contact 8 is located on a principal surface (outer surface) of the receptacle insulator 2a. The connecting portion 8c is provided with the depression or recess 8b for positioning each bump for connection of a printed circuit board. The second part 9b of the groove 9 is provided with an escape groove 2h formed on its side wall as a notch.

On the other hand, the plug contact 7 of the plug 1 comprises a connecting portion 7d of a rectangular plate shape, a press-fit portion 7e and a base portion 7c extending from opposite ends of the connecting portion 7d in the first direction A1, respectively, and faced to each other, a U-shaped leaf spring portion 7b extending from an extended end of the base portion 7c in the second direction A2, and a plug contacting portion 7a formed at an end of the leaf spring portion 7b.

The plug insulator 1a has a plurality of press-fit holes 1h and a plurality of leaf spring insert holes (not shown) to receive the press-fit portions 7e and the leaf spring portions 7b of the plug contacts 7, respectively. The plug insulator 1a is provided with a plurality of ribs 1i formed on its surface faced to the receptacle insulator 2a to be inserted into the groove 9 of the receptacle insulator 2a. The ribs 1i are movable within the groove 9 in the second direction A2. Each of the ribs 1i has a recess (support portion) 1j formed on its side surface for receiving and supporting the leaf spring portion 7b of the plug contact 7 and an umbrella portion 1b formed at an end of the recess 1j to protrude in a lateral direction. The umbrella portion 1b serves to prevent the plug contact 7 from being deformed under any external force. The plug contact 7 is fixed when the press-fit portion 7e is press-fitted into the press-fit hole 1h of the plug insulator 1a. The leaf spring portion 7b passes through the insert hole of the plug insulator 1a to be positioned and supported in the recess 1j of the rib 1i. The contacting portion 7a protrudes outward from the recess 1j. The contacting portion 7d of the plug contact 7 is located on a principal surface (outer surface) of the plug insulator 1a. The contacting portion 7d is provided with a recess 7f for positioning and connecting each bump of the CPU package.

When the receptacle 2 is inserted into the plug 1, each receptacle contacting portion 8a is inserted into a position, i.e., the escape groove 2h in the first part 9a, where the umbrella portion 1b is not formed. When the receptacle 2 is forced to slide with respect to the plug 1, each receptacle contacting portion 8a is transferred to another position, i.e., the second part 9b, below each umbrella portion 1b to be brought into contact with the plug contacting portion 7a formed at the one end of the plug contact 7. Before sliding the receptacle 2 with respect to the plug 1, the receptacle contact 8 and the plug contact 7 have a positional relationship illustrated in FIG. 10A. After sliding the receptacle 2 with respect to the plug 1, the receptacle contact 8 and the plug contact 7 have a positional relationship illustrated in FIG. 10B.

The leaf spring portion 7b has a U shape extending from the base portion 7c to an extended end at one side in the second direction A2, folded at the extended end, and extending back from the extended end to the other side. The leaf spring portion 7b serves to bring the plug contacting portion 7a into contact with the receptacle contacting portion 8a with an elastic force exerted in the third direction A3. The recess 1j backs up the leaf spring portion 7b to stably maintain the elastic force in the third direction A3, thereby improving the reliability in mechanical contact and electrical connection between the plug contact 7 and the receptacle contact 8. The umbrella portion 1b extends from the supporting portion 1h to be faced to the leaf spring portion 7b in the first direction A1.

The above-mentioned particular direction is inclined with respect to the second direction A2 so that the elastic force exerted by the leaf spring portion 7b acts to enhance the contact between the plug contacting portion 7a and the receptacle contacting portion 8a. Thus, the elastic force by the leaf spring 7b does not act in a releasing direction to release the contact between the plug contacting portion 7a and the receptacle contacting portion 8a.

Figure 12:
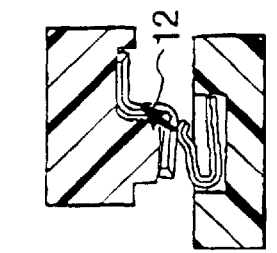
FIG. 12 is a view for describing comparison in contact redundancy between the BGA socket in FIGS. 5–10 and the PGA socket in FIGS. 1–3.
Figure 13:
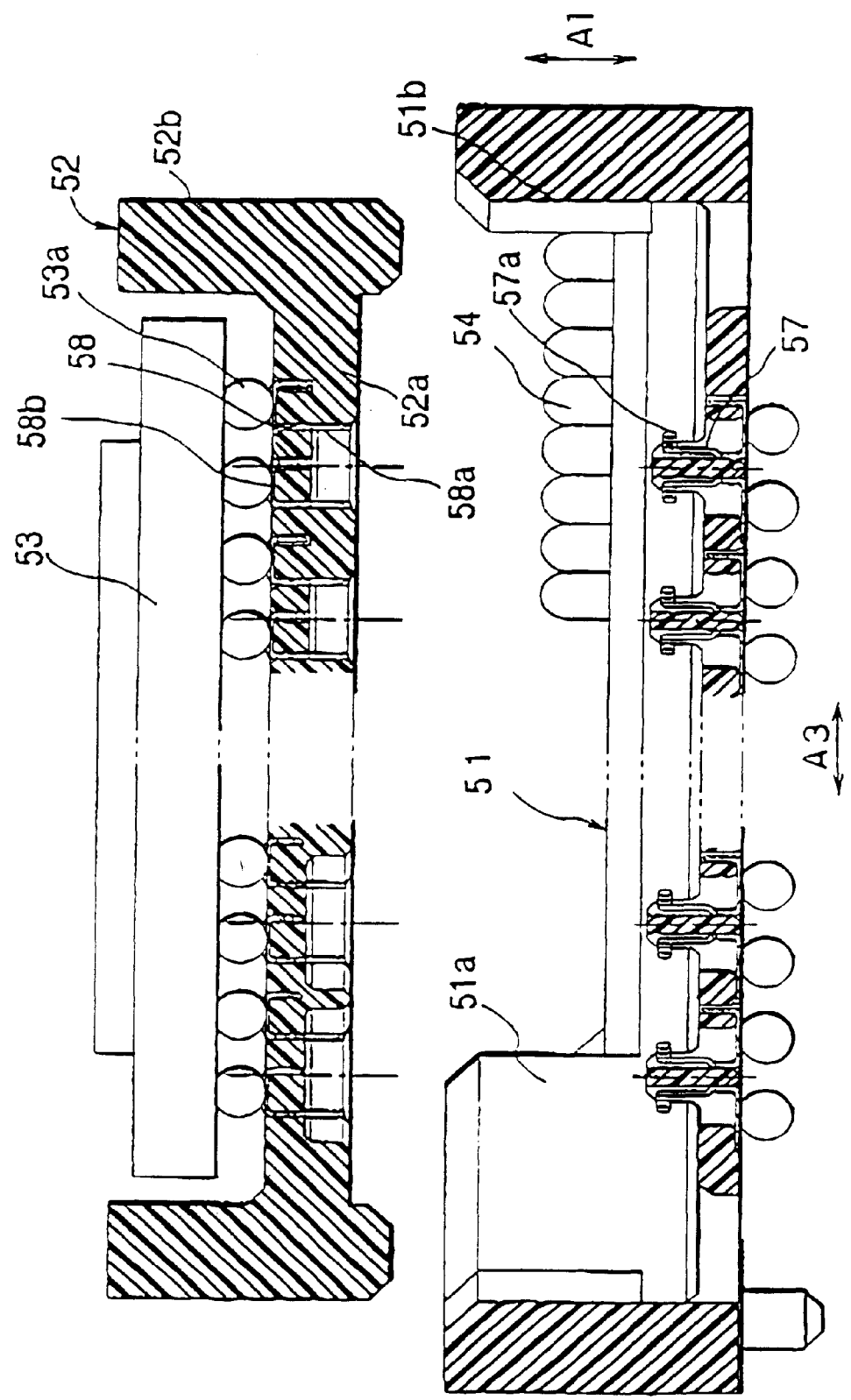
FIG. 13 is an exploded sectional view showing a BGA socket as an electrical connector according to a second embodiment of this invention together with a CPU package.
Figure 14:
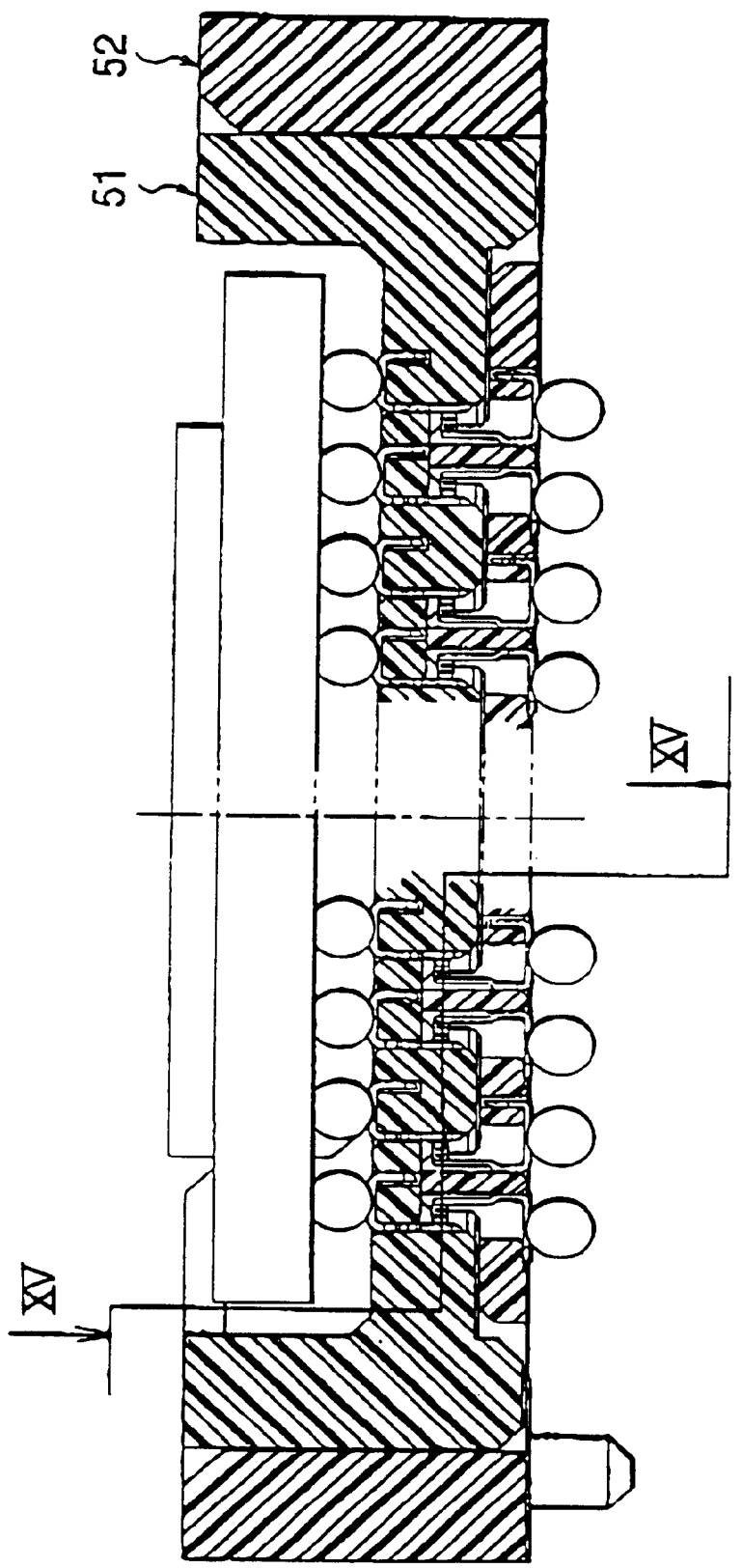
FIG. 14 is a sectional view of the BGA socket illustrated in FIG. 13 after the CPU package is connected thereto.

Referring to FIG. 12, comparison will be made between the BGA socket in FIGS. 5–10 and the PGA socket in FIGS. 1–3 with respect to the contact redundancy. It is assumed here that a slide distance has a nominal design value S and a tolerance of ±0.15 mm. In FIG. 12, tour states A, B, C, and D correspond to the slide distance of 0 (before coupling), S–0.15 mm, S (nominal design value), and S+0.15 mm, respectively.

In the BGA socket, the receptacle contacting portion 8a is inclined with respect to the second direction A2. Therefore, a reactive force exerted by the plug contacting portion 7a upon the receptacle contacting portion 8a acts in a direction depicted by an arrow 12, i.e., to pull the receptacle 2 in a coupling direction. Thus, in case where the BGA socket is subjected to mechanical vibration or shock, the receptacle 2 and the plug 1 can be prevented from undesired decoupling (release). Therefore, an effective contact can be achieved over a range covering the states B (S–0.15 mm), C (S), and D (S+0.15 mm).

On the other hand, consideration will be made of the PGA socket. In the state B in which the sliding distance is equal to S–0.15 mm, a reactive force exerted by the socket contacting portion 21d of the socket contact 21c upon the pin contact 22a acts in a direction depicted by an arrow 13, i.e., to push back the pin contact 22a. Thus, in case where the PGA socket is subjected to mechanical vibration or shock, undesired decoupling will occur. Therefore, an effective contact can be achieved over a smaller range covering the states C (S) and D (S+0.15 mm).

As will be understood from the foregoing, the BGA socket in FIGS. 5–10 is advantageous in contact redundancy over the PGA socket in FIGS. 1–3. Therefore, it is possible to improve the reliability of contact.

Next referring to FIGS. 13 through 15B, description will be made of an electrical connector according to a second embodiment of this invention.

The electrical connector illustrated in the figures is also called a BGA socket and used for connection of a CPU package 3. The BGA socket comprises a plug 51 and a receptacle 52. The plug 51 comprises a plug insulator 51a provided with plug-side anti-buckling walls 57a formed on four sides thereof to stand upright in a vertical direction. The plug insulator 51a includes a number of plug contacts 57 attached thereto in a matrix arrangement. Each plug contact 57 has a plug contacting portion 57a formed at its one end. The plug insulator 51a is provided with a locking member 54 for locking the receptacle 52. The receptacle 52 comprises a receptacle insulator 52a. The receptacle insulator 52a is provided with receptacle-side anti-buckling walls 52b formed on four sides thereof to stand upright in the vertical direction. The receptacle insulator 52a includes a number of receptacle contacts 58 attached thereto in a matrix arrangement. Each receptacle contact 58 has a receptacle contacting portion 58a. Each receptacle contact 58 has a depression 58b serving as a connecting portion for receiving and connecting each of bumps 53a of the CPU package 3.

Figure 15A:
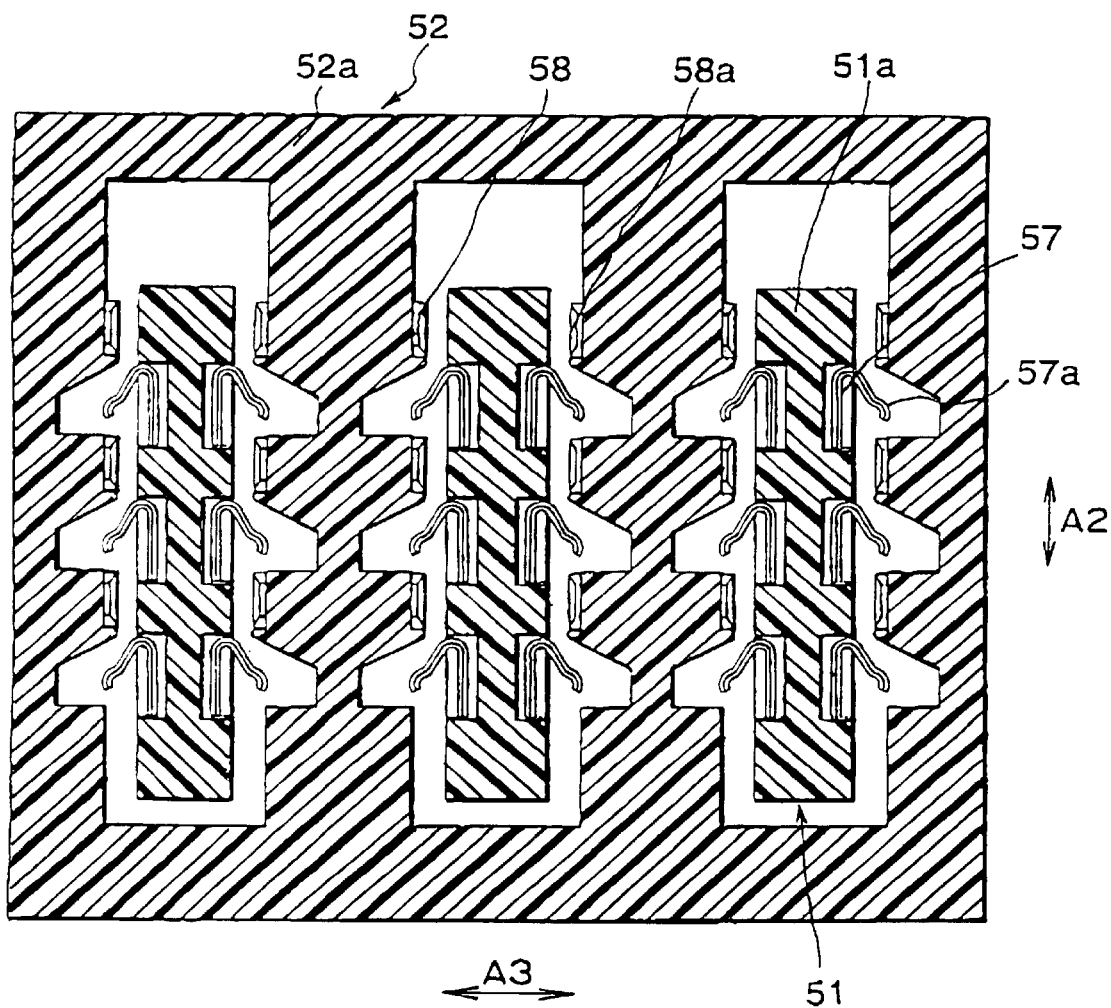
FIG. 15A is a sectional view taken along a line XV—XV in FIG. 14 before a plug contact and a socket contact are connected to each other.

In case where the plug 51 and the receptacle 52 have a positional relationship illustrated in FIG. 15A, the receptacle contacting portion 58a is separated from the plug contacting portion 57a. When the receptacle 52 is forced to slide in the second direction A2 with respect to the plug 51 to obtain a positional relationship illustrated in FIG. 15B, the receptacle contacting portion 58a is brought into contact with the plug contacting portion 57a.

The BGA socket in the second embodiment is similar in operation to the BGA socket in the first embodiment but is different in structure in the following respects. Specifically, instead of the umbrella portions 1b of the plug insulator 1a in the first embodiment, the receptacle-side anti-buckling walls 52b and the plug-side anti-buckling walls 51b are provided in the second embodiment to prevent buckling of the plug contacts 57.

Referring to FIGS. 16A and 16B, description will be made about how to prevent buckling of the plug contacts 57. In FIGS. 16A and 16B, the receptacle 52 is inclined with respect to the plug 51 clockwise and counterclockwise, respectively. In the illustrated positions, the receptacle 52 can not be inserted into the plug 51. However, the receptacle-side anti-buckling walls 52b are guided substantially in parallel to the plug-side anti-buckling walls 51b, respectively, to place the receptacle 52 in proper position with respect to the plug 51. Thus, the buckling of the plug contacts 57 can be avoided.

Figure 15B:
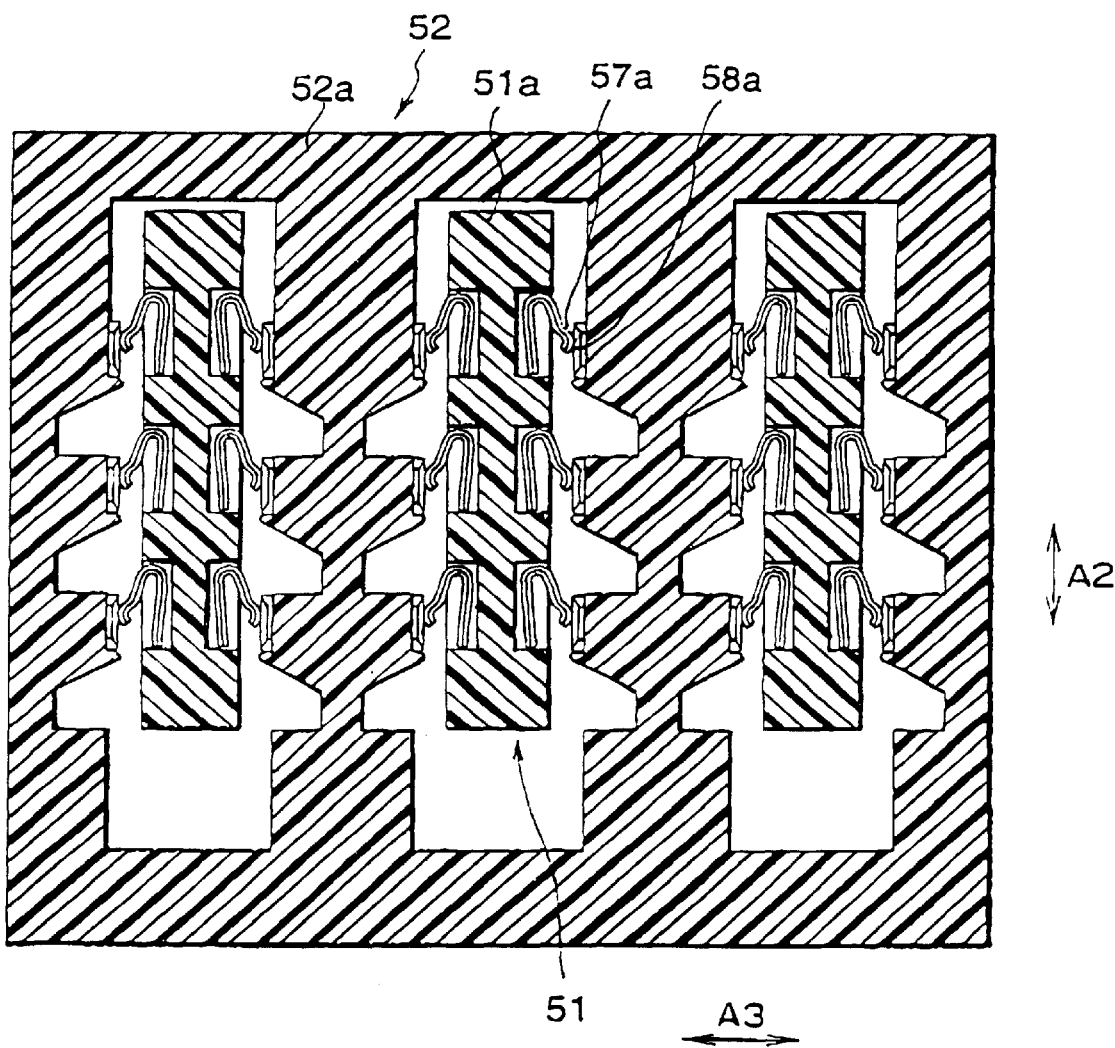
FIG. 15B is a sectional view similar to FIG. 15A but after the plug contact and the socket contact are connected to each other.

In the first embodiment, the receptacle contacting portion 8a is inclined with respect to the second direction A2 shown in FIGS. 11A and 11B. In the second embodiment, the receptacle contacting portion 58a is not inclined with respect to the second direction A2, as illustrated in FIGS. 15A and 15B.

In the first embodiment, the receptacle 2 and the plug 1 are prevented from decoupling by two factors including the inclination of the receptacle contacting portion 8a and the provision of the locking member 4. However, either one factor can be omitted. The above-mentioned electrical connector can be implemented as a zero insertion force (ZIF) connector and is particularly advantageous for use as a socket for connecting an IC package or an LSI package having a LGA and a BGA.

What is claimed is:

1. An electrical connector comprising:
   a first insulator;
   a first contact supported by said first insulator and having a first contact portion;
   a second insulator faced to said first insulator in a first direction and having a side wall defining a groove which extends along said first insulator to have a first and a second part arranged in a second direction perpendicular to said first direction;
   a second contact having a second contacting portion which is placed in said second part of the groove and supported by said side wall, said second contacting portion having a flat shape and extending in a particular direction approximate to said second direction, said first contacting portion being inserted into said first part of the groove and carried toward said second part of the groove by a relative movement between said first and said second insulators in said second direction, said first contacting portion having an elastic force when in said second part of the groove, and being brought into contact with said second contacting portion with said elastic force in a third direction perpendicular to said first and said second directions, said first contact further having a leaf spring portion formed adjacent to said first contacting portion to exert said elastic force, said first contact further having a base portion in the vicinity of said leaf spring portion, said first insulator having a supporting portion supporting said base portion in said third direction, and said first insulator having an umbrella portion extending from said supporting portion to be faced to said leaf spring portion in said first direction.

2. An electrical connector as claimed in claim 1, wherein said particular direction is determined so that said elastic force does not act in a releasing direction to release the contact between said first and said second contacting portions.

3. An electrical connector as claimed in claim 1, wherein said particular direction is inclined with respect to said second direction so that said elastic force acts to enhance the contact between said first and said second contacting portions.

4. An electrical connector as claimed in claim 1, wherein said first contact further has a leaf spring portion formed adjacent to said first contacting portion to exert said elastic force.

5. An electrical connector as claimed in claim 4, wherein said first contact further has a base portion in the vicinity of said leaf spring portion, said first insulator having a supporting portion supporting said base portion in said third direction.

6. An electrical connector as claimed in claim 5, wherein said leaf spring portion has a U-shape extending from said base portion in said second direction to an extended end at one side thereof, folded back at said extended end, and extending back towards the other side opposite to the one side.

7. An electrical connector as claimed in claim 1, wherein said first and said second contacts have connecting portions exposed out of end faces of said first and said second insulators in said first direction, respectively.

8. An electrical connector comprising:

a first insulator;

a first contact supported by said first insulator and having a first contact portion;

a second insulator faced to said first insulator in a first direction and having a side wall defining a groove which extends along said first insulator to have a first and a second part arranged in a second direction perpendicular to said first direction;

a second contact having a second contacting portion which is placed in said second part of the groove and supported by said side wall, said second contacting portion having a flat shape and extending in a particular direction approximate to said second direction, said first contacting portion being inserted into said first part of the groove and carried toward said second part of the groove by a relative movement between said first and said second insulators in said second direction said first contacting portion having an elastic force when in said second dart of the groove, and being brought into contact with said second contacting portion with said elastic force in a third direction perpendicular to said first and said second directions, said first and second contacts having connecting portions exposed out of end faces of said first and second insulators in said first direction, respectively, and said connecting portions having depressions for receiving bumps to be connected.

9. An electrical connector as claimed in claim 1, wherein said first insulator has opposite side walls for guiding said relative movement in cooperation with said second insulator.

10. An electrical connector as claimed in claim 1, further comprising a locking member attached to said first insulator to be movable in said third direction, said locking member preventing said relative movement between said first and said second insulators when said first and said second contacts are brought into contact with each other.

11. An electrical connector comprising:

a first insulator;

a first contact supported by said first insulator and having a first contact portion;

a second insulator faced to said first insulator in a first direction and having a side wall defining a groove which extends along said first insulator to have a first and a second part arranged in a second direction perpendicular to said first direction;

a second contact having a second contacting portion which is placed in said second part of the groove and supported by said side wall, said second contacting portion having a flat shape and extending in a particular direction approximate to said second direction, said first contacting portion being inserted into said first part of the groove and carried toward said second part of the groove by a relative movement between said first and said second insulators in said second direction, said first contacting portion having an elastic force when in said second part of the groove, and being brought into contact with said second contacting portion with said elastic force in a third direction perpendicular to said first and said second directions, said first insulator having opposite side walls for guiding relative movement in cooperation with said second insulator, and said first insulator having a pair of protrusions formed on each of said opposite side walls while said second insulator has a pair of recesses formed on each of opposite end portions in said third direction to receive said protrusions.

12. An electrical connector as claimed in claim 11, wherein said protrusions on one of said opposite side walls are different in size from those on the other of said opposite side walls.

13. An electrical connector as claimed in claim 11 wherein said protrusions on one of said opposite side walls are different in position in said second direction from those on the other of said opposite side walls.

14. An electrical connector as claimed in claim 13, wherein said protrusion on one of said opposite end portions is different in size from that on the other of said opposite end portions.

15. An electrical connector comprising:

a first insulator;

a first contact supported by said first insulator and having a first contact portion;

a second insulator faced to said first insulator in a first direction and having a side wall defining a groove which extends along said first insulator to have a first and a second part arranged in a second direction perpendicular to said first direction, said second insulator having protrusions formed at opposite end portions in said second direction, said first insulator having recesses for receiving said protrusions;

a second contact having a second contacting portion which is placed in said second part of the groove and supported by said side wall, said second contacting portion having a flat shape and extending in a particular direction approximate to said second direction, said first contacting portion being inserted into said first part of the groove and carried toward said second part of the groove by a relative movement between said first and said second insulators in said second direction, said first contacting portion having an elastic force when in said second part of the groove, and being brought into contact with said second contacting portion with said elastic force in a third direction perpendicular to said first and said second directions.

* * * * *